US011042353B2

(12) United States Patent
Cremer et al.

(10) Patent No.: US 11,042,353 B2
(45) Date of Patent: Jun. 22, 2021

(54) MONITORING LOUDNESS LEVEL DURING MEDIA REPLACEMENT EVENT USING SHORTER TIME CONSTANT

(71) Applicant: Roku, Inc., San Jose, CA (US)

(72) Inventors: Markus K. Cremer, Orinda, CA (US); Shashank Merchant, Sunnyvale, CA (US); Robert Coover, Orinda, CA (US); Todd J. Hodges, Oakland, CA (US); Joshua Ernest Morris, Oakland, CA (US)

(73) Assignee: Roku, Inc., San Jose, CA (US)

( * ) Notice: Subject to any disclaimer, the term of this patent is extended or adjusted under 35 U.S.C. 154(b) by 0 days.

(21) Appl. No.: 16/684,514

(22) Filed: Nov. 14, 2019

(65) Prior Publication Data

US 2020/0162048 A1 May 21, 2020

Related U.S. Application Data

(60) Provisional application No. 62/909,676, filed on Oct. 2, 2019, provisional application No. 62/861,474, filed
(Continued)

(51) Int. Cl.
*H03G 3/24* (2006.01)
*G06F 3/16* (2006.01)
(Continued)

(52) U.S. Cl.
CPC ............. *G06F 3/165* (2013.01); *G06N 3/08* (2013.01); *H03G 3/24* (2013.01); *H03G 3/3005* (2013.01);
(Continued)

(58) Field of Classification Search
CPC .... H04N 21/439; H04N 5/147; H04N 21/812; H04N 5/60; H04N 3/08; H03G 3/3089; H03G 3/24; H03G 3/3005; G06F 3/165
(Continued)

(56) References Cited

U.S. PATENT DOCUMENTS

2002/0068525 A1\* 6/2002 Brown .................. H04H 60/06
455/3.01
2004/0109094 A1 6/2004 Lindsay et al.
(Continued)

FOREIGN PATENT DOCUMENTS

CN 102946520 B 12/2016
KR 10-2009-0057813 6/2009
(Continued)

OTHER PUBLICATIONS

International Search Report received for PCT Patent Application No. PCT/US2019/061632, dated Mar. 5, 2020, 5 pages.
(Continued)

*Primary Examiner* — Melur Ramakrishnaiah
(74) *Attorney, Agent, or Firm* — McDonnell Boehnen Hulbert & Berghoff LLP

(57) ABSTRACT

In one aspect, an example method includes (i) determining, by a playback device, a first loudness level of a first portion of first media content from a first source while the playback device presents the first media content, with the first portion having a first length; (ii) switching, by the playback device, from presenting the first media content from the first source to presenting second media content from a second source; (iii) based on the switching, determining, by the playback device, second loudness levels of second portions of the first media content while the playback device presents the second media content, with the second portions having a second length that is shorter than the first length; and (iv) while the playback device presents the second media content, adjusting, by the playback device, a volume of the playback device based on one or more of the second loudness levels.

20 Claims, 5 Drawing Sheets

Related U.S. Application Data on Jun. 14, 2019, provisional application No. 62/768,596, filed on Nov. 16, 2018.

(51) Int. Cl.
*H04N 21/439* (2011.01)
*H04N 21/81* (2011.01)
*H03G 3/30* (2006.01)
*G06N 3/08* (2006.01)
*H04N 5/14* (2006.01)

(52) U.S. Cl.
CPC ........... *H03G 3/3089* (2013.01); *H04N 5/147* (2013.01); *H04N 21/439* (2013.01); *H04N 21/812* (2013.01)

(58) Field of Classification Search
USPC ........................................ 700/94; 381/17–18
See application file for complete search history.

(56) References Cited

U.S. PATENT DOCUMENTS

| | | |
|---|---|---|
| 2012/0250895 A1 | 10/2012 | Katsianos |
| 2015/0012938 A1 | 1/2015 | Kosslyn |
| 2015/0319506 A1 | 11/2015 | Kansara et al. |
| 2016/0254795 A1 | 9/2016 | Ballard |
| 2017/0094215 A1 | 3/2017 | Western |
| 2017/0094351 A1* | 3/2017 | Gordon ............ H04N 21/23418 |
| 2017/0311107 A1 | 10/2017 | Ward et al. |
| 2018/0069517 A1 | 3/2018 | Crockett et al. |
| 2018/0234728 A1* | 8/2018 | Hwang .............. H04N 21/4316 |
| 2018/0270526 A1 | 9/2018 | Nguyen et al. |
| 2020/0159489 A1 | 5/2020 | Cremer et al. |

FOREIGN PATENT DOCUMENTS

| | | | |
|---|---|---|---|
| KR | 10-2014-0033860 A * | 3/2014 | ............... H03G 3/32 |
| KR | 10-2014-0033860 A | 3/2014 | |
| WO | 2014067206 A1 | 5/2014 | |

OTHER PUBLICATIONS

Written Opinion received for PCT Patent Application No. PCT/US2019/061632, dated Mar. 5, 2020, 7 pages.

The International Search Report and Written Opinion of the International Searching Authority dated Dec. 11, 2020 and issued in connection with International Application No. PCT/US2019/059882, filed Nov. 5, 2019, 10 pages.

Non-Final Office Action dated Dec. 10, 2020 and issued in connection with U.S. Appl. No. 16/673,859, filed Nov. 4, 2019, 22 pages.

* cited by examiner

MONITORING LOUDNESS LEVEL DURING MEDIA REPLACEMENT EVENT USING SHORTER TIME CONSTANT

CROSS-REFERENCE TO RELATED APPLICATIONS

This disclosure claims priority to U.S. Provisional Patent App. No. 62/768,596, filed on Nov. 16, 2018, U.S. Provisional Patent App. No. 62/861,474, filed on Jun. 14, 2019, and U.S. Provisional Patent App. No. 62/906,676, filed on Oct. 2, 2019, each of which is hereby incorporated by reference in its entirety.

USAGE AND TERMINOLOGY

In this disclosure, unless otherwise specified and/or unless the particular context clearly dictates otherwise, the terms "a" or "an" mean at least one, and the term "the" means the at least one.

In this disclosure, the term "connection mechanism" means a mechanism that facilitates communication between two or more components, devices, systems, or other entities. A connection mechanism can be a relatively simple mechanism, such as a cable or system bus, or a relatively complex mechanism, such as a packet-based communication network (e.g., the Internet). In some instances, a connection mechanism can include a non-tangible medium (e.g., in the case where the connection is wireless).

In this disclosure, the term "computing system" means a system that includes at least one computing device. In some instances, a computing system can include one or more other computing systems.

BACKGROUND

In coming years, the replacement of advertisements in media content with targeted advertisements is expected to become an increasingly important advertising method. By way of example, in a dynamic advertisement insertion (DAI) system, a content provider can insert generic advertisements into advertisement-breaks that interrupt sequences of media content, such as live or pre-recorded content. Each advertisement-break can include a set of advertisements arranged in a predetermined order. Further, a particular one of the advertisements can be designated or dynamically selected to be replaced with replacement media content, such as a targeted advertisement.

With this arrangement, prior to displaying the particular advertisement, the playback device can obtain the replacement media content, and then provide the replacement media content for display instead of the particular advertisement. For instance, responsive to determining that the playback device is playing or about to play content immediately preceding the particular advertisement to be replaced, the playback device can retrieve a targeted advertisement from a database, and then provide the targeted advertisement for display in place of the particular advertisement at the appropriate time.

SUMMARY

In one aspect, an example method is disclosed. The method includes (i) determining, by a playback device, a first loudness level of a first portion of first media content from a first source while the playback device presents the first media content, with the first portion having a first length; (ii) switching, by the playback device, from presenting the first media content from the first source to presenting second media content from a second source; (iii) based on the switching, determining, by the playback device, second loudness levels of second portions of the first media content while the playback device presents the second media content, with the second portions having a second length that is shorter than the first length; and (iv) while the playback device presents the second media content, adjusting, by the playback device, a volume of the playback device based on one or more of the second loudness levels.

In another aspect, an example non-transitory computer-readable medium is disclosed. The computer-readable medium has stored thereon program instructions that upon execution by a processor, cause performance of a set of acts including (i) determining a first loudness level of a first portion of first media content from a first source while a playback device presents the first media content, with the first portion having a first length; (ii) switching from presenting the first media content from the first source to presenting second media content from a second source; (iii) based on the switching, determining second loudness levels of second portions of the first media content while the playback device presents the second media content, with the second portions having a second length that is shorter than the first length; and (iv) while the playback device presents the second media content, adjusting a volume of the playback device based on one or more of the second loudness levels.

In another aspect, an example computing system is disclosed. The computing system is configured for performing a set of acts including (i) determining a first loudness level of a first portion of first media content from a first source while a playback device presents the first media content, with the first portion having a first length; (ii) switching from presenting the first media content from the first source to presenting second media content from a second source; (iii) based on the switching, determining second loudness levels of second portions of the first media content while the playback device presents the second media content, with the second portions having a second length that is shorter than the first length; and (iv) while the playback device presents the second media content, adjusting a volume of the playback device based on one or more of the second loudness levels.

DETAILED DESCRIPTION

I. Overview

Figure 1:
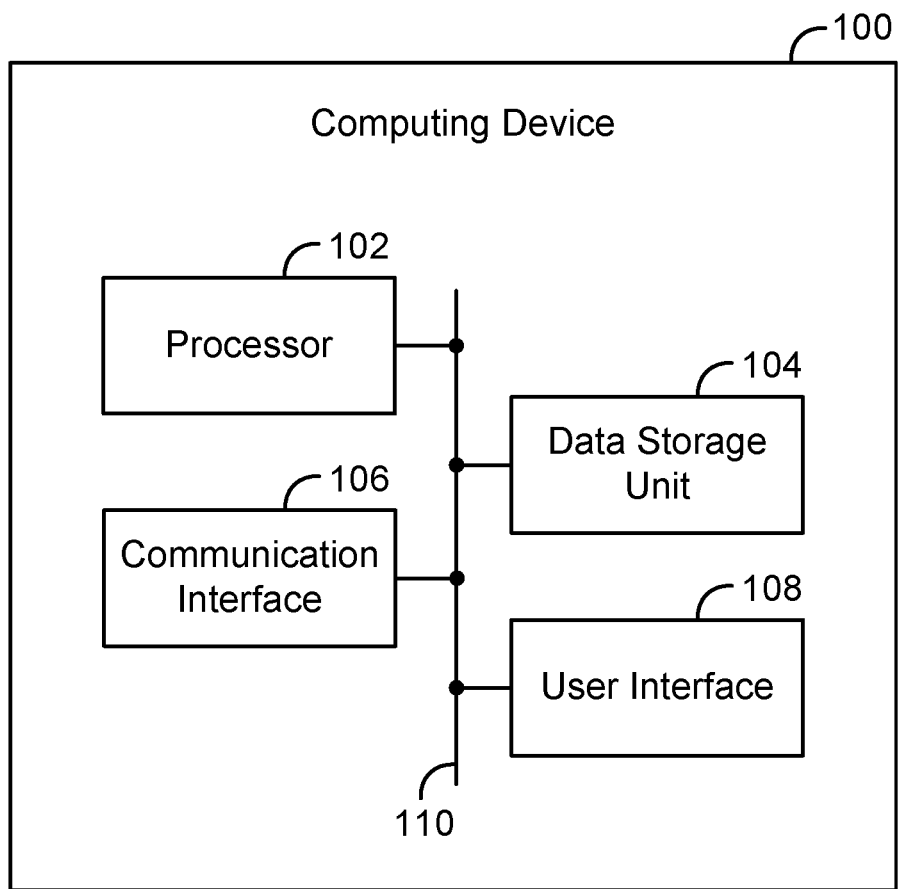
FIG. 1 is a simplified block diagram of an example computing device.

During a media content replacement event on a playback device, second media content (i.e. replacement media content) is presented in lieu of a portion of first media content. For instance, during a media content replacement event, a segment of first media content received from a first source is replaced with second media content received from a second source. To effect the replacement, the playback device can switch from presenting first media content that is received from the first source to presenting second media content that is received from the second source. In some cases, this switching of sources may be imperceptible to a user.

Furthermore, in some cases, during a media content replacement event in which the playback device presents the second media content from the second source in place of the first media content from the first source, any volume playback information of the first source might not be accessible to the playback device. For instance, the volume playback information of the first source may be set by a device providing an audio signal to the playback device, and the volume playback information might not be accessible to the playback device. As a consequence, during a media content replacement event, if a user attempts to adjust a volume of the playback device using a remote control that can control the device providing the audio signal to the playback device, the intended adjustment might not be accessible to the playback device. For instance, if the user attempts to increase or decrease the volume, information regarding the requested change might not be accessible to the playback device, and the playback device may nevertheless continue presenting the second media content at a same volume level. To the user attempting to adjust the volume, it may appear as if the remote control is malfunctioning or as if the playback device is not responding to the attempted volume adjustment. This can lead to a poor or frustrating user-experience for the viewer.

Disclosed herein are methods and systems to address this and potentially other issues. In accordance with this disclosure, during a media content replacement event, a device that provides the first media content to the playback device can provide to the playback device an audio signal corresponding to the first media content that is being replaced by the second media content. The device can provide the audio signal corresponding to the first media content to the playback device even though the playback device is presenting the second media content in lieu of the first media content. While the playback device is presenting the second media content, the playback device can monitor the audio signal corresponding to the first media content by measuring loudness levels of the first media content. If a volume level of the first media content is changed by a user, the audio signal that the playback device is monitoring will indicate this volume change, and the playback device can detect the change. Advantageously, the playback device can then respond to the detected user-triggered volume adjustment by carrying out a corresponding volume adjustment to the second media content.

Furthermore, to help the playback device quickly detect and respond to such changes to the volume level of the first media content, the playback device can determine loudness levels for fixed-length portions of the first media content during the media content replacement event. The length of these portions can be shorter than a length of portions that the playback device analyzes when media content replacement events are not occurring. By way of example, when a media content replacement event begins, the playback device can switch from analyzing thirty-second portions of the first media content to analyzing one-second portions of the first media content, or portions of the first media content that are less than one second (e.g., half-second portions).

While portions of this disclosure refer to a media content replacement event involving an advertisement, the examples are not meant to be limiting. The systems and methods disclosed herein are also applicable to replacing any content segment that is part of a content stream from one source with a content segment from another source. Other types of replaceable content can include weather segments, news segments, sports segments, radio advertisements, etc. The content stream that includes replaceable content can also be provided from a variety of sources, such as server or URL on the internet. Thus, the examples provided below are not meant to be limiting.

II. Example Architecture

A. Computing Device

FIG. 1 is a simplified block diagram of an example computing device 100. Computing device 100 can perform various acts and/or functions, such as those described in this disclosure. Computing device 100 can include various components, such as processor 102, data storage unit 104, communication interface 106, and/or user interface 108. These components can be connected to each other (or to another device, system, or other entity) via connection mechanism 110.

Processor 102 can include a general-purpose processor (e.g., a microprocessor) and/or a special-purpose processor (e.g., a digital signal processor (DSP)).

Data storage unit 104 can include one or more volatile, non-volatile, removable, and/or non-removable storage components, such as magnetic, optical, or flash storage, and/or can be integrated in whole or in part with processor 102. Further, data storage unit 104 can take the form of a non-transitory computer-readable storage medium, having stored thereon program instructions (e.g., compiled or non-compiled program logic and/or machine code) that, when executed by processor 102, cause computing device 100 to perform one or more acts and/or functions, such as those described in this disclosure. As such, computing device 100 can be configured to perform one or more acts and/or functions, such as those described in this disclosure. Such program instructions can define and/or be part of a discrete software application. In some instances, computing device 100 can execute program instructions in response to receiving an input, such as from communication interface 106 and/or user interface 108. Data storage unit 104 can also store other types of data, such as those types described in this disclosure.

Communication interface 106 can allow computing device 100 to connect to and/or communicate with another entity according to one or more protocols. In one example, communication interface 106 can be a wired interface, such as an Ethernet interface or a high-definition serial-digital-interface (HD-SDI). In another example, communication interface 106 can be a wireless interface, such as a cellular or WI-FI interface. In this disclosure, a connection can be a direct connection or an indirect connection, the latter being a connection that passes through and/or traverses one or more entities, such as a router, switcher, or other network device. Likewise, in this disclosure, a transmission can be a direct transmission or an indirect transmission.

User interface 108 can facilitate interaction between computing device 100 and a user of computing device 100, if applicable. As such, user interface 108 can include input components such as a keyboard, a keypad, a mouse, a touch-sensitive panel, a microphone, and/or a camera, and/or output components such as a display device (which, for example, can be combined with a touch-sensitive panel), a sound speaker, and/or a haptic feedback system. More generally, user interface 108 can include hardware and/or software components that facilitate interaction between computing device 100 and the user of the computing device 100.

Computing device 100 can take various forms, such as a workstation terminal, a desktop computer, a laptop, a tablet, a mobile phone, or a television.

B. Dynamic Advertisement Insertion (DAI) System

Figure 2:
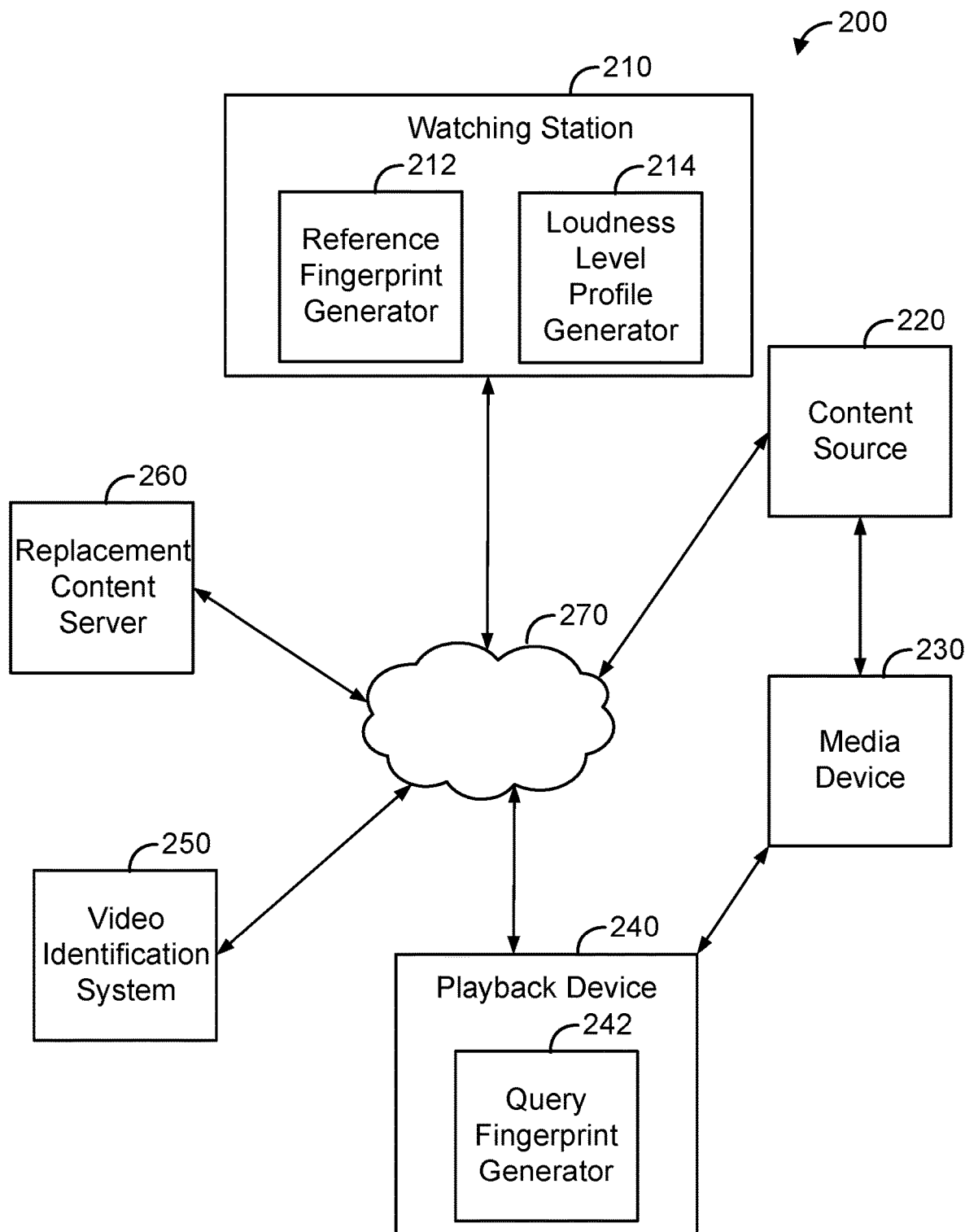
FIG. 2 is a simplified block diagram of an example dynamic advertisement insertion (DAI) system.

FIG. 2 is a simplified block diagram of an example DAI system 200. The DAI system 200 can perform various acts and/or functions related to the delivery and/or presentation of media content (e.g., audio content and/or video content), and can be implemented as a computing system.

DAI system 200 can include various components, such as a watching station 210, a content source 220, a media device 230, a playback device 240, a video identification system 250, and a replacement content server 260, each of which can be implemented as a computing system.

Watching station 210 can receive video and other multimedia content from content source 220, such as a broadcaster, web server, or cable television (TV) station. For example, content source 220 may be a broadcaster, such as a TV station or TV network, which streams or transmits media over a TV channel to watching station 210, and/or a web service, such as a website, that streams or transmits media over a network 270 to watching station 210. Watching station 210 includes a reference fingerprint generator 212 that generates reference fingerprints of video content received from content source 220. Watching station 210 can send generated reference fingerprints to video identification system 250.

Watching station 210 also includes a loudness level profile generator 214. Alternatively, loudness level profile generator 214 can be part of another computing system that is separate from watching station 210. Loudness level profile generator 214 can generate loudness level profiles for segments of media content. By way of example, loudness level profile generator 214 can generate loudness level profiles for replaceable advertisements that are replaced with replacement advertisements during media content replacement events.

A loudness level profile can characterize how loudness changes over time in a segment of media content. For instance, a loudness level profile can include respective loudness levels (e.g., root mean square (RMS) loudness levels or loudness, K-weighted, relative to full scale (LKFS) loudness levels) for different portions of the segment of media content. As one example, a loudness level profile for a thirty-second advertisement can include a sequence of loudness levels corresponding to portions of the advertisement. The portions could be overlapping or distinct from one another. For instance, each loudness level can be a moving average that is calculated based on characteristics of the audio signal for the advertisement during a fixed-length portion (e.g., half of a second, one second, etc.).

In some implementations, an initial loudness level for an advertisement can be calculated based on a RMS of an initial one-second portion of the audio signal. Then a subsequent loudness level can be calculated based on a subsequent one-second portion of the audio signal. Alternatively, in other implementations, an initial loudness level can be calculated based on a RMS of an initial three-second portion of the audio signal. Then a subsequent loudness level can be calculated based on a subsequent three-second portion of the audio signal, with a portion of the subsequent three-second portion overlapping a portion of the initial three-second portion. For example, the subsequent three-second portion can include the last two seconds of the initial portion, as a well as an additional portion that is subsequent to the initial portion.

Loudness level profile generator 214 can calculate the loudness levels of a loudness level profile using a loudness meter. The loudness meter can include a software module configured to execute on watching station 210. The software module can execute various filtering algorithms, such as those recommended by the International Telecommunication Union, to determine the loudness level. The software module can measure individual loudness levels of multiple channels of an audio signal, and then average and sum the individual loudness levels to arrive at a loudness level.

Loudness level profile generator 214 can generate an index of loudness level profiles. For instance, loudness level profile generator 214 can store generated loudness level profiles in association with corresponding identifiers for the segments of media content from which the loudness level profiles are generated. Watching station 210 can send generated loudness level profiles to video identification system 250, playback device 240, replacement content server 260, and/or another computing system.

Media device 230 can receive the video and other multimedia content from content source 220, such as via a broadcast channel and/or over network 270. Media device 230 can modify the received content before sending content to playback device 240. Media device 230 can include a tuner configured to receive an input stream of video content and generate an output stream of video content by processing the input stream. Media device 230 can be a device equipped with tuners, decoders, and other hardware and/or software such that media device 230 can access video content through a video content distribution network, such as a terrestrial broadcast, cable, and/or satellite broadcast network employed by multichannel video programming distributors. Additionally or alternatively, media device 230 can be a device equipped with network adapters, decoders, and other hardware and/or software such that media device 230 can access video content through a wide area network (e.g., the internet) employed by devices for accessing internet video streaming services. Media device 230 can output signals (e.g., digital or analog signals) usable by a speaker and display of playback device 240 to present video content to a user.

Playback device 240 is any device capable of receiving and presenting a stream of video and/or other multimedia content (e.g., a TV, a laptop or other personal computer (PC), a tablet or other mobile device, or a gaming device). Playback device 240 can include a display or other user interface configured to display a processed stream of video content. The display may be a flat-panel screen, a plasma screen, a light emitting diode (LED) screen, a cathode ray tube (CRT), a liquid crystal display (LCD), or a projector. Playback devices can also include one or more speakers. In addition, playback device 240 can include an antenna configured to receive audio and video by way of an over-the-air broadcast channel.

Network 270 may be any network that enables communication between devices, such as a wired network and/or a wireless network (e.g., a mobile network). Network 270 can include one or more portions that constitute a private network (e.g., a cable TV network or a satellite TV network) or a public network (e.g., over-the-air broadcast channels or the internet).

Video identification system 250 can communicate with watching station 210 and playback device 240 over network 270. Video identification system 250 may receive a query fingerprint generated from video content by a query fingerprint generator 242 of playback device 240, and query an index of known fingerprints generated by a reference fingerprint generator 212 of watching station 210 in order to identify the video content. The query fingerprint may be a fingerprint of a frame or block of frames within the video content. Video identification system 250 can identify the video content by matching the query fingerprint with one or more reference fingerprints. In some examples, video identification system 250 can be a component or module of playback device 240 or media device 230.

Upon identifying the video content, video identification system 250 can return to playback device 240 an identifier for replacement media content (e.g., alternative programming or alternative commercials) associated with the video content. The replacement media content can be stored in replacement content server 260. Using the identifier, playback device 240 can access the replacement media content from replacement content server 260 and then provide the replacement media content for display. Alternatively, replacement content server 260 or another computing system can send the replacement media content to playback device 240 or media device 230 in advance (e.g., a few seconds, minutes, or hours before media device 230 is scheduled to perform the replacement operation), for storage in a local cache of playback device 240 or media device 230. In this implementation, playback device 240 can access the replacement media content from the local cache, and then provide the replacement media content for display. Employing this local caching technique can help ensure that playback device 240 receives the replacement media content in time to carry out the replacement operation. This can be especially useful in situations where playback device 240 has an unreliable or unpredictable Internet connection, for instance.

In addition, upon identifying the video content, video identification system 250 can return to playback device 240 an identifier of a loudness level profile associated with the video content. The identifier can be an identifier of the video content, for instance. The loudness level profile can be stored at watching station 210, replacement content server 260, or at another computing system. Using the identifier, playback device 240 can access the loudness level profile from, for instance, watching station 210 or replacement content server 260. Alternatively, watching station 210 or another computing system can send the loudness level profile to playback device 240 or media device 230 in advance, for storage in a local cache of playback device 240 or media device 230. In this implementation, playback device 240 can access the loudness level profile from the local cache.

Any of the modules, systems, and/or generators may be located at any of the devices shown in FIG. 2. For example, video identification system 250 can include query fingerprint generator 242. With this arrangement, video identification system 250 can receive frames of video content from playback device 240 and generate the query fingerprints using the frames of video content. As another example, media device 230 and playback device 240 can be integrated together within a single device. Other variations are also possible.

Although the description of DAI system 200 and other portions of this disclosure refer to identifying video content using fingerprinting, the examples are not meant to be limiting. The systems and methods disclosed herein can also identify video content using watermarking. For instance, watching station 210 can embed a watermark within the video content (e.g., an audio watermark or a video watermark). With this approach, playback device 240 can detect the watermark within the video content, and send the watermark to video identification system 250. Or playback device 240 can send frames of video content to video identification system, and video identification system 250 can detect the watermark within the frames of video content. After obtaining the watermark, video identification system 250 can then identify the video content using the watermark, and return to playback device 240 an identifier for replacement media content associated with the video content. Similarly, the systems and methods disclosed herein can identify video content using information embedded in a video stream. For instance, watching station 210 can embed an identifier in side information or ancillary information of a video stream. The identifier could signal a media content replacement event, and playback device 240 could detect this embedded information. As another example, media content replacement events can be triggered by certain closed caption information. Watching station 210 can modify closed caption information of video content to include a text string or sequence of string, which triggers a countdown to the start of a media content replacement event. Playback device 240 could then be configured to look for the text string or sequence of strings, so that playback device 240 can determine when the media content replacement event is to occur.

Figure 3:
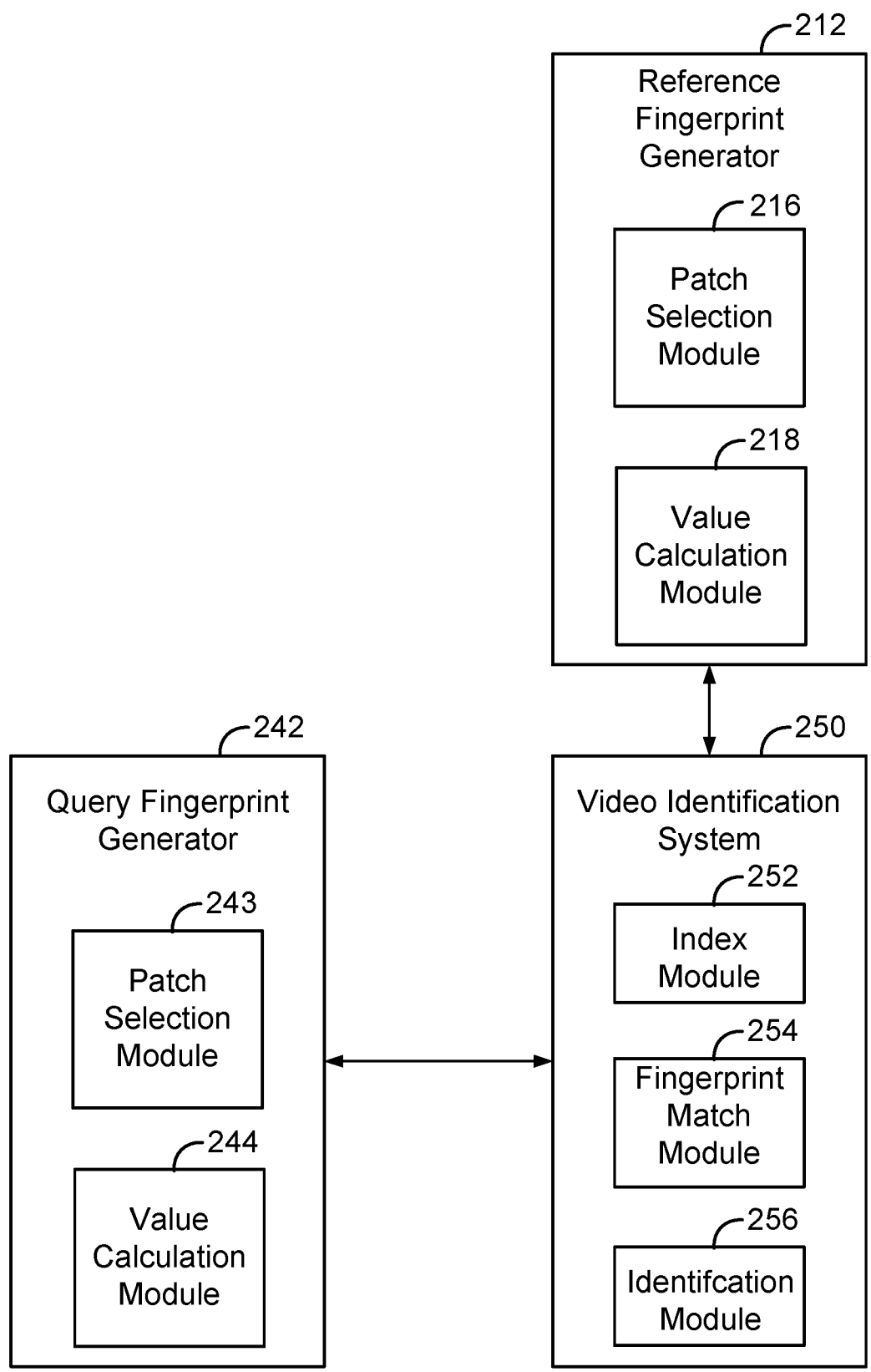
FIG. 3 is a simplified block diagram illustrating components of a reference fingerprint generator, a query fingerprint generator, and a video identification system, according to an example embodiment.

FIG. 3 is a simplified block diagram illustrating components of reference fingerprint generator 212, query fingerprint generator 242, and video identification system 250. As shown in FIG. 3, query fingerprint generator 242 includes a patch selection module 243 and a value calculation module 244, configured to communicate with each other (e.g., via a bus, shared memory, or a switch). Further, video identification system 250 includes an index module 252, a fingerprint match module 254, and an identification module 256, all configured to communicate with each other. Still further, reference fingerprint generator 212 includes a patch selection module 216 and a value calculation module 218, configured to communicate with each other.

One or more of the modules depicted in FIG. 3 can be implemented using hardware (e.g., a processor of a machine, a field-programmable gate array (FPGA), or an application-specific integrated circuit (ASIC), or a combination of hardware and software. Moreover, any two or more of the modules depicted in FIG. 3 can be combined into a single module, and the function described herein for a single module can be subdivided among multiple modules.

In line with the discussion above, query fingerprint generator 242 and reference fingerprint generator 212 can be configured to generate a fingerprint of one or more frames of video content. For example, query fingerprint generator 242 and reference fingerprint generator 212 can calculate values of patches of one or more frames within the video content. Patches can be located at different locations within a frame. Query fingerprint generator 242 and reference fingerprint generator 212 can be configured to combine fingerprints from multiple frames to generate a fingerprint of a block of frames of the video content.

By way of example, patch selection module 243 of query fingerprint generator 242 can be configured to select multiple patches of video content, such as patches associated with one or more regions of a frame or frames within the video content. Similarly, patch selection module 216 of reference fingerprint generator 212 can be configured to select multiple patches of video content, such as patches associated with one or more regions of a frame of frames within the video content.

Patches can be defined by dividing a frame into a grid, such as a 2×2 grid, a 4×3 grid, or a 4×4 grid, and selecting patches based on the grid. For instance, twenty patches may be selected, with four large patches corresponding to quadrants of a frame, and four small patches corresponding to sub-quadrants of each quadrant (i.e. sixteen small patches in total). In some instances, patches may overlap. Further, patches can cumulatively span less than the entirety of a frame.

Value calculation module 244 of query fingerprint generator 242 can be configured to calculate a value for each of the selected multiple patches using, for example, an integral image technique. The integral image technique may calculate the values using a summed area table or other data structure that generates a sum of values of a group of pixels. Similarly, value calculation module 218 of reference fingerprint generator 212 can be configured to calculate a value for each of the selected multiple matches using, for example, an integral imaging technique.

In some examples, value calculation module 244 and value calculation module 218 can calculate a value for a patch by summing the values of a group of pixels with the patch, averaging the values of a group of pixels, or determining a media value of the group of pixels. Additionally or alternatively, value calculation module 244 and value calculation module 218 can calculate a value for a patch by computing differences between values of a group of pixels or computing a linear combination of values of a group of pixels.

Index module 252 of video identification system 250 can be configured to query a database of known reference fingerprints of video content, such as a database of known fingerprints stored within watching station 210 or video identification system 250, in order to identify reference fingerprints potentially matching a query fingerprint. Index module 252 can be configured to query an index of quantized patch values of the known reference fingerprints.

Fingerprint match module 254 of video identification system 250 can be configured to compare a query fingerprint to one or more known reference fingerprints, and determine that the query fingerprint matches at least one known reference fingerprint. For example, fingerprint match module 254 can determine that query fingerprint matches at least one known reference fingerprint by determining that a similarity between the query fingerprint and at least one of the known reference fingerprints satisfies a predetermined threshold. The predetermined threshold can be associated with a Tanimoto distance measurement, a Manhattan distance measurement, or other distance measurements. Additionally or alternatively, fingerprint match module 254 can use other matching techniques, such as Euclidian, Cosine, KL-Divergence, and/or Itakura matching techniques.

Identification module 256, in turn, can be configured to identify video content based on a determination that a query fingerprint(s) matches at least one reference fingerprint(s). For example, identification module 256 can identify the name or title of video content, a location within the video content currently being presented by playback device 240, and/or a channel or broadcaster providing the video content.

Figure 4:
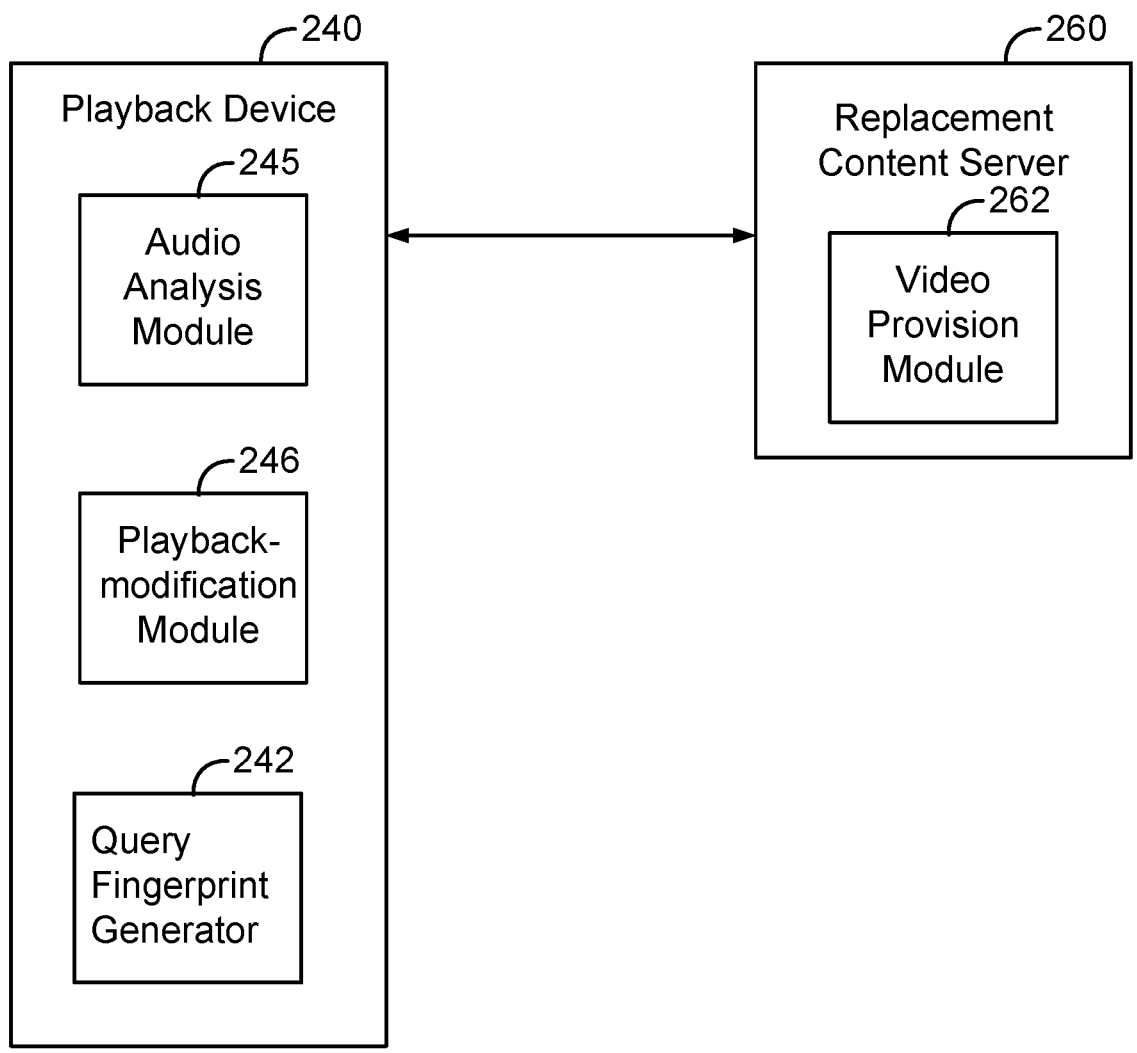
FIG. 4 is a simplified block diagram illustrating components of a playback device and a replacement content server, according to an example embodiment.

FIG. 4 is a simplified block diagram illustrating components of playback device 240 and replacement content server 260. As shown in FIG. 4, in addition to query fingerprint generator 242, playback device 240 includes an audio analysis module 245 and a playback-modification module 246, which can be configured to communicate with each other. Further, replacement content server 260 includes a video provision module 262.

Playback device 240 can encounter a trigger to carry out a media content replacement event. The media content replacement event can involve switching from presenting first media content from a first source to presenting second media content from a second source. The first source can be a first content pipe, and the second source can be a second content pipe that is different from the first content pipe. For instance, the first source can be either an over-the-air antenna or media device 230, and the second source can be either the Internet or a local cache of playback device 240. As a particular example, the first media content can be a first multimedia segment that is received by way of an over-the-air antenna or media device 230, and the second media content can be a second multimedia segment that is received from replacement content server 260 over network 270 and stored in a local cache of playback device 240. Alternatively, the first source can be an over-the-air antenna, and the second source can be media device 230. As another example, the first source can be network 270 (e.g., the first media content can be a multimedia stream), and the second source can be either a local cache of playback device 240 or media device 230.

Encountering the trigger can involve determining that playback device 240 is presenting a first segment that occurs immediately prior to a second segment that is to be replaced. Playback device 240 could determine that the first segment is being presented using any of the fingerprinting or watermarking techniques discussed above. Alternatively, encountering the trigger can involve playback device 240 receiving a replacement command from another device.

Playback device 240 can instruct audio analysis module 245 to determine a first loudness level of a first portion of the first media content. Audio analysis module 245 can determine the first loudness level prior to encountering the trigger. The first loudness level can be a moving average that audio analysis module 245 continuously or intermittently determines as playback device 240 presents the first media content. In one example, on a fixed-interval basis, audio analysis module 245 can calculate a loudness level (e.g., root mean square (RMS)) for a recently presented portion of the first media content (e.g., the previous one minute, the previous thirty seconds, etc.). The first loudness level can be calculated using a loudness meter. As time goes on, audio analysis module 245 can average loudness levels of multiple portions of the first media content together (e.g. average of five, one-minute portions). The multiple portions of the first media content could be overlapping or separate from one another. Further, when a desired number of loudness levels are obtained, audio analysis module 245 can begin to replace the oldest (most-stale) loudness level with a new (most-recent) loudness level, so as to arrive at a moving average of the first loudness level. Other examples are also possible.

The loudness meter can include a software module configured to execute on playback device 240 and/or a server device with which playback device 240 is communicatively linked. The software module can execute various filtering algorithms, such as those recommended by the International Telecommunication Union, to determine the first loudness level. The software module can measure the individual loudness of multiple channels of an audio signal, and then average and sum the individual loudness measurements to determine the loudness level.

In some examples, a loudness level profile (i.e. loudness over time) for the first media content can be provided to playback device 240, either as a stream or in bulk, by a server. The loudness level profile can characterize how the loudness changes over time in the first media content. This could, e.g., on the server side, have been pre-computed and associated with a determined fixed volume value (e.g., average loudness, or some target volume measure). Audio analysis module 245, after aligning this loudness level profile with the loudness values measured from the first media content, can then determine, as the first loudness level, the difference in level from the reference (as analyzed remotely on the server) to the first media content as observed by the device.

In some examples, playback device 240 can detect a channel-change event. Upon detecting the channel-change event, playback device 240 can instruct audio analysis module 245 to reset the moving average of the first loudness level. As one example, playback device 240 could detect the channel-change event using audio and/or video fingerprinting of the first media content. As another example, playback device 240 could receive a signal (e.g., a High-Definition Multimedia Interface signal) from a device providing the first media content, with the signal indicating that a channel change has occurred. Playback device 240 could therefore determine, based on receipt of the signal, that a channel-change event occurred. As another example, playback device 240 could detect a channel-change event by using template matching to recognize the display of a channel bar that is presented by a device that provides the first media content (e.g., media device 230 of FIG. 2) in conjunction with channel changes.

Video provision module 262 of replacement content server 260 can provide the second media content to playback device 240. For instance, video identification system 250 can identify video content that playback device 240 is providing for display and, based on the identified video content, video provision module 262 can provide replacement media content corresponding to the video content to playback device 240. Playback device 240 can receive the second media content by way of a network communication interface. For instance, the second media content can be replacement media content that is streamed to playback device 240 over the Internet and then stored in a local cache of playback device 240.

Upon encountering the trigger, playback device 240 can also obtain a loudness level profile for the portion of first media content that playback device 240 will be replacing. For instance, based on video identification system 250 having identified the video content that playback device 240 is providing for display, video identification system 250 can obtain the loudness level profile for the portion of first media content that playback device 240 will be replacing, and provide the loudness level profile to playback device 240. Alternatively, video identification system 250 can provide an identifier to playback device 240, such that playback device 240 can retrieve the loudness level profile from a local cache or another computing system using the identifier.

Responsive to encountering the trigger, playback device 240 can switch from presenting the first media content to presenting the second media content. For example, when playback device 240 encounters a trigger to insert the second media content into a sequence of media content, playback device 240 can retrieve the replacement media content from the local cache, and provide the replacement media content for display using a media player that is configured to display media files. Providing the replacement media content for display using a media player can involve presenting the replacement media content in a media-player layer that is on top of another layer in which other media content is provided for display, such as media content received from a media device or an antenna.

In some instances, providing the second media content for display can involve switching from providing media content that is received from media device 230 or an antenna to providing replacement media content that is stored in a database of playback device 240. Playback device 240 can include a system on a chip that includes a frame buffer. In order to provide the replacement media content for display, the media player of playback device 240 can insert the replacement media content into the frame buffer. Prior to inserting the replacement media content into the frame buffer, the system on a chip may have inserted media content that is received from media device 230 into the frame buffer.

The second media content can include a replacement advertisement. For instance, the second media content can include targeted advertisement that is to be substituted for a generic advertisement. As one example, the targeted advertisement can be a local advertisement, and the generic advertisement can be a national advertisement. As another example, the targeted advertisement can be an advertisement that is selected based on a demographic of a user of playback device 240.

In some instances, playback device 240 can adjust a loudness level of the second media content prior to presenting the second media content. For instance, audio analysis module 245 of playback device 240 can determine a loudness level of the second media content, and playback device 240 can then adjust the loudness level of the second media content based on a difference between the loudness level of the second media content and the loudness level of the first media content. In some examples, playback device 240 may replace two advertisements in sequence. For instance, after presenting the second media content, playback device may present third media content (e.g., another replacement advertisement). In this case, playback device 240 can be configured to adjust the loudness level of the third media content in the same manner as playback device 240 adjusts the loudness level of the second media content.

Audio analysis module 245 of playback device 240 can determine a loudness level of the second media content in various ways. As one example, audio analysis module 245 can determine the loudness level of the second media content based on auxiliary information that is received with the second media content from replacement content server 260. For instance, the loudness level could be specified within header information of the second media content. As another example, audio analysis module 245 can determine the loudness level by processing an audio signal associated with the second media content. As still another example, audio analysis module 245 can use a default loudness level to which advertisements are intended to conform as the loudness level.

In some instances, the loudness level of the first media content and the loudness level of the second media content can be specified on an absolute scale. In other instances, the loudness level of the first media content and the loudness level of the second media content can be specified in decibels. The loudness levels can include perceptual volume weighting such as K-weighting relative to full scale (LKFS).

Playback-modification module 246 can adjust the loudness of the second media content based on a difference between the loudness level of the first media content and the loudness level of the second media content so as to generate modified media content. For instance, upon determining that the loudness level of the first media content is less than the loudness level of the second media content, playback-modification module 246 can decrease the loudness of the second media content. Decreasing the loudness level can involve decreasing the loudness of the second media content from the determined loudness level to a new loudness level. The new loudness level could be approximately equal to the loudness level of the first media content. Or the new loudness level could be a level between the loudness level of the second media content and the loudness level of the first media content.

Whereas, upon determining that the loudness level of the first media content is greater than the loudness level of the second media content, playback-modification module 246 can increase the loudness of the second media content. For instance, playback-modification module 246 can increase the loudness of the second media content from the determined loudness level to a new loudness level. The new loudness level could be approximately equal to the loudness level of the first media content. Or the new loudness level could be a level between the loudness level of the second media content and the loudness level of the first media content.

Adjusting the loudness level of the second media content can involve adjusting an audio signal of the second media content after decoding the audio signal. For instance, playback-modification module 246 can attenuate the audio signal to reduce the loudness or, conversely, playback-modification module 246 can amplify the audio signal to increase the loudness. When amplifying the loudness of the audio signal, playback-modification module 246 can use a compressor to reduce a difference between the lowest and highest points in the audio signal and/or use a limiter to prevent any peaks from exceeding a threshold. For purposes of this disclosure, adjusting the loudness level of a media content is synonymous with adjusting the audio volume level of a media content. Accordingly, an adjustment to a volume does not necessarily have to involve psychoacoustic weighting of the spectrum.

In some examples, playback-modification module 246 can determine that a difference between the loudness level of the first media content and the loudness level of the second media content satisfies a threshold condition and, based on the difference satisfying the threshold condition, playback-modification module 246 can adjust the loudness of the second media content. Conversely, if the difference does not satisfy the threshold condition, playback-modification module 246 may refrain from adjusting the loudness of the second media content and present the second media content as is during the media content replacement event. The threshold condition may be the difference being greater than a threshold amount, for instance.

Regardless of whether or not playback device 240 modifies a loudness of the second media content prior to presenting the second media content, during the media content replacement event, playback device 240 can track the loudness of portions of the first media content that is being replaced by the second media content. By tracking the loudness level of the first media content, playback device 240 can detect a user-triggered volume adjustment, and perform a volume correction with respect to the second media content that is being presented by the playback device. In this manner, if a user adjusts a volume level using a remote control that can control the device providing the audio signal to playback device 240, playback device 240 can make a corresponding adjustment to the volume of playback device 240 during the media content replacement event.

To help playback device 240 quickly detect and respond to changes to the volume level of the first media content, audio analysis module 245 can determine loudness levels for fixed-length portions of the first media content during the media content replacement event. The length of these portions can be shorter than a length of portions that audio analysis module 245 analyzes when media content replacement events are not occurring (e.g., prior to a media content replacement event). By way of example, when a media content replacement even begins, the audio analysis module 245 can switch from analyzing thirty-second portions of the first media content to analyzing one-second portions of the first media content, or portions that are less than a second in length.

As a particular example, prior to a media content replacement event, audio analysis module 245 can determine loudness levels for thirty-second portions of the first media content. Optionally, playback device 240 can use these loudness levels to perform an appropriate overall volume adjustment to the second media content if necessary. Subsequently, during the media content replacement event, audio analysis module 245 can determine first, second, third, and fourth loudness levels for first, second, third, and fourth consecutive one-second portions of the first media content. Audio analysis module 245 can calculate these loudness levels using a loudness meter, for instance. Audio analysis module 245 can then use one or more of the loudness levels determined during the media content replacement event to determine whether a user-triggered volume adjustment occurred.

Audio analysis module 245 can detect user-triggered volume adjustments in various ways. As one example, audio analysis module 245 can determine that a loudness level of a given portion of the first media content differs from a loudness level of a subsequent portion by more than a threshold amount. The subsequent portion can be immediately subsequent to the given portion. For instance, the given portion can span from time T2 to time T3 of the first media content, and the subsequent portion can span from time T3 to time T4 of the first media content, with the given portion and the subsequent portion being the same length. In such a scenario, audio analysis module 245 can also determine a target volume for playback device 240, so that playback device 240 can adjust a volume of playback device 240 toward the target volume.

As another example, audio analysis module 245 can use a neural network to detect user-triggered volume adjustments. For instance, the neural network can be trained using audio samples that are known to include user-triggered volume adjustments. The neural network can include an input layer configured to receive two or more loudness levels, multiple hidden layers of nodes, and an output layer. Audio analysis module 245 can provide multiple consecutive loudness levels as input to the neural network, and the neural network can output data at the output layer, with the data classifying the input loudness levels as either being characteristic of a user-triggered volume adjustment or characteristic of a fluctuation that is inherent to the media content.

Accordingly, audio analysis module 245 can analyze the output of the neural network to determine whether or not the consecutive loudness levels are indicative of a user-triggered volume adjustment. Upon determining that the output of the neural network is indicative of a user-triggered volume adjustment, audio analysis module 245 can then determine an appropriate volume adjustment. For instance, audio analysis module 245 can identify a trend in the consecutive loudness levels (e.g., an increase in loudness over time or a decrease in loudness over time), and output this trend for use in adjusting the volume of playback device 240.

Alternatively, audio analysis module 245 can detect a user-triggered volume adjustment by comparing a loudness level of the first media content to a corresponding reference loudness level indicated by a loudness level profile for the first media content. During the media content replacement event, audio analysis module 245 can be configured to determine the loudness level of the first media content using a time interval having a same length as the time interval that loudness level profile generator 214 used to generate the loudness level profile for the first media content. By way of example, the time interval used by loudness level profile generator 214 can be one second. With this implementation, audio analysis module 245 can be configured to determine loudness levels for one-second portions of the first media content as playback device 240 receives the first media content from the first source. For instance, on a fixed-interval basis, audio analysis module 245 can calculate a loudness level (e.g., root mean square (RMS)) for a recently received portion of the first media content (e.g., the previous one second).

To facilitate comparisons between loudness levels determined by audio analysis module 245 and loudness levels indicated by the loudness level profile, audio analysis module 245 can align the loudness level profile with the audio signal that playback device 240 is receiving from the first source. Audio analysis module 245 can perform this alignment in various ways. In one example, audio analysis module 245 can align the loudness level profile to the audio signal using fingerprinting. To align the loudness level profile using fingerprinting, audio analysis module 245 can receive a reference fingerprint corresponding to the loudness level profile and compare the reference fingerprint with query fingerprints derived from the first media content. Each query fingerprint derived from the first media content can have an associated timestamp. Upon determining that the reference fingerprint matches one of the query fingerprints, audio analysis module 245 can use the timestamp associated with the query fingerprint to align the loudness level profile with the audio signal that playback device 240 is receiving. For instance, audio analysis module 245 can be arranged to interpret the matching of the reference fingerprint to the query fingerprint to mean that an initial loudness level of the loudness level profile corresponds to the timestamp associated with the query fingerprint. Or audio analysis module 245 can be arranged to interpret the matching of the reference fingerprint to the query fingerprint to mean that the initial loudness level of the loudness level profile corresponds to a time that is offset from the timestamp associated with the query fingerprint by an offset amount (e.g., one second after the timestamp, two seconds after the timestamp, etc.).

The reference fingerprint used to align the loudness level profile can be an audio fingerprint or a video fingerprint. Playback device 240 can obtain the reference fingerprint from a computing system that provides the loudness level profile to playback device 240, such as watching station 210.

In a similar manner, audio analysis module 245 can align the loudness level profile to the audio signal that the playback device 240 is receiving using a watermark. To align the loudness level profile using a watermark, audio analysis module 245 can receive a watermark corresponding to the loudness level profile. Audio analysis module 245 can then detect that the watermark is present at a particular time within the first media content. Further, audio analysis module 245 can be arranged to interpret the detecting of the watermark at the particular time to mean that an initial loudness level of the loudness level profile corresponds to the particular time. Alternatively, audio analysis module 245 can be arranged to interpret the detecting of the watermark at the particular time to mean that an initial loudness level of the loudness level profile corresponds to a time that is offset from the particular time by an offset amount (e.g., one second after the particular time, two seconds after the particular time, etc.).

After aligning the loudness level profile to the audio signal that playback device 240 is receiving from the first source, audio analysis module 245 can select a reference loudness level from the loudness level profile that corresponds to a loudness level of the audio signal determined by audio analysis module 245. For instance, audio analysis module 245 may have determined that an initial loudness level of the loudness level profile aligns with a time T1 of the audio signal. Further, based on having determined a loudness level for the first media content using a portion of the first media content that occurs five seconds after time T1, audio analysis module 245 can select a reference loudness level of the loudness profile that corresponds to a time that is five seconds after the time to which the the initial loudness level corresponds.

After selecting a reference loudness level from the loudness level profile, audio analysis module 245 can then compare the reference loudness level to the determined loudness level. In some instances, the determined loudness level and the reference loudness level can be specified on an absolute scale. In other instances, the determined loudness level and the second loudness level can be specified in decibels. The first loudness level and the second loudness level can include perceptual volume weighting such as K-weighting relative to full scale (LKFS).

Based on a result of the difference between these two loudness levels, audio analysis module 245 can determine a target volume for playback device 240. For instance, audio analysis module 245 can determine that the loudness level of the playback device 240 audio signal exceeds the corresponding reference loudness level indicated by the loudness level profile by a first amount, and audio analysis module 245 can determine, as the target volume, a volume that is equal to a sum of a current volume of playback device 240 and the first amount (or a sum of the current volume and a value that is proportional to the first amount). Conversely, audio analysis module 245 can determine that the reference loudness level indicated by the loudness level profile exceeds the loudness level of the playback device 240 audio signal by a second amount, and audio analysis module 245 can determine, as the target volume, a volume that is equal to a difference between the current volume of playback device 240 and the second amount (or a difference between the current volume and a value that is proportional to the second amount).

Playback-modification module 246 can adjust the volume of playback device 240 toward a target volume while playback device 240 presents the second media content in place of the first media content. For instance, audio analysis module 245 can provide a target volume to playback-modification module 246, and playback-modification module 246 can gradually adjust the volume of the playback device toward the target volume using a smoothing filter. Using a smoothing filter allows for adjusting the volume of the playback device from a current volume to the target volume in less than a second (e.g., over the course of one hundred milliseconds). In this manner, playback-modification module 246 can adjust the volume of playback device 240 to account for a user-triggered volume adjustment, such as a volume adjustment that is triggered by transmitting an instruction from a remote control to media device 230. In a similar manner, during the course of the media content replacement event, playback device 240 can make subsequent comparisons between determined loudness levels and reference loudness levels, and perform subsequent adjustments to the volume of the playback device.

In some examples, audio analysis module 245 can detect that the audio signal of the first media content rapidly and unexpectedly becomes very low/muted for a longer than normal time (e.g., longer than the length of short pauses in spoken content). Based on detecting such a pause, playback-modification module 246 can mute the audio signal of the second media content. In this manner, if the user mutes the first media content (e.g., using a remote control of media device 230) during the media content replacement event, playback device 240 can also mute the second media content that is presented in place of the first media content.

III. Example Operations

Figure 5:
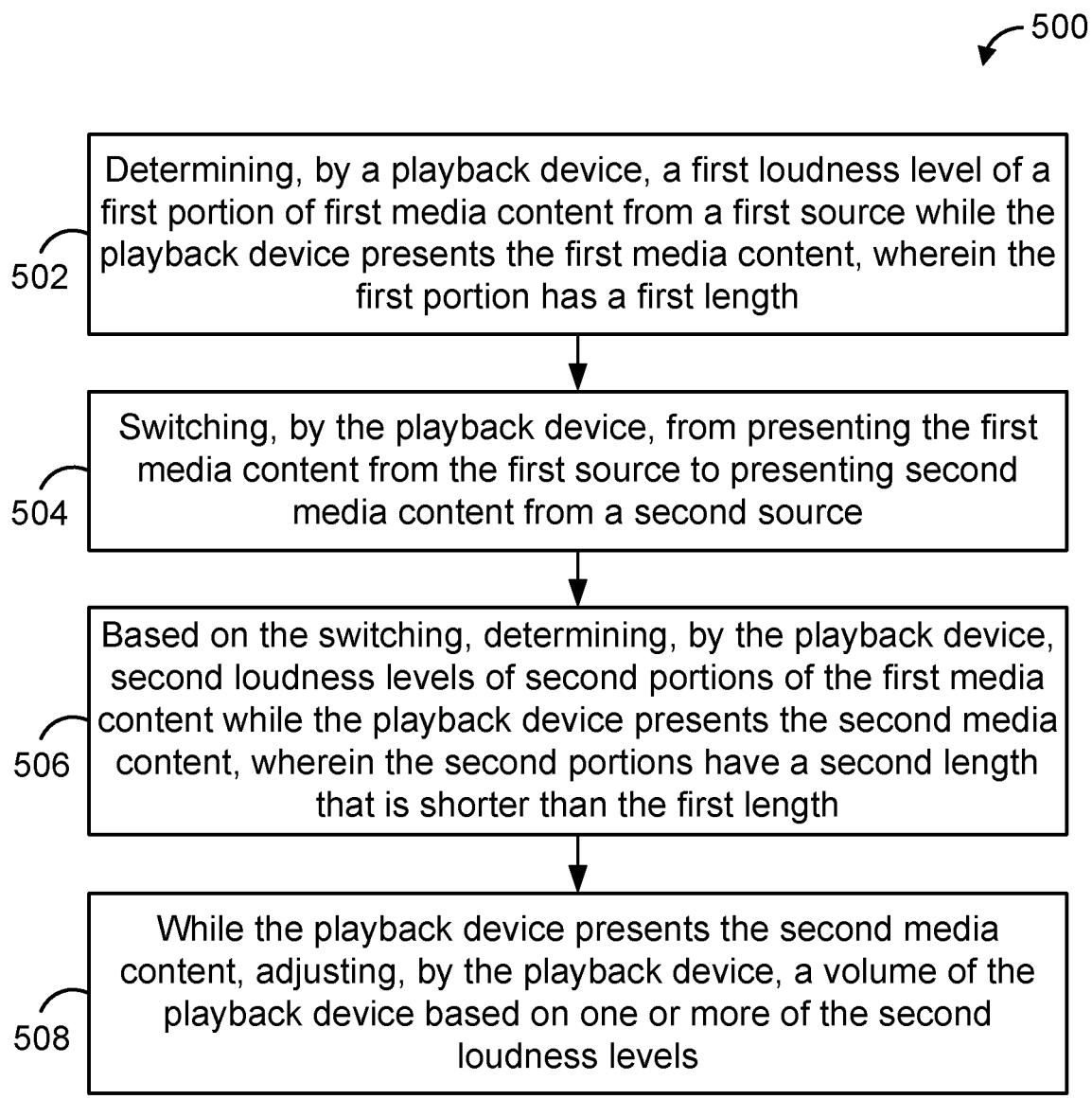
FIG. 5 is a flow chart of an example method.

FIG. 5 is a flow chart of an example method 500. Method 500 can be carried out by a playback device, such as playback device 240 or more generally, by a computing system. At block 502, method 500 includes determining, by a playback device, a first loudness level of a first portion of first media content from a first source while the playback device presents the first media content. The first portion has a first length. At block 504, method 500 includes switching, by the playback device, from presenting the first media content from the first source to presenting second media content from a second source. At block 506, method 500 includes, based on the switching, determining, by the playback device, second loudness levels of second portions of the first media content while the playback device presents the second media content. The second portions have a second length that is shorter than the first length. And at block 508, method 500 includes, while the playback device presents the second media content, adjusting, by the playback device, a volume of the playback device based on one or more of the second loudness levels.

IV. Example Variations

Although some of the acts and/or functions described in this disclosure have been described as being performed by a particular entity, the acts and/or functions can be performed by any entity, such as those entities described in this disclosure. Further, although the acts and/or functions have been recited in a particular order, the acts and/or functions need not be performed in the order recited. However, in some instances, it can be desired to perform the acts and/or functions in the order recited. Further, each of the acts and/or functions can be performed responsive to one or more of the other acts and/or functions. Also, not all of the acts and/or functions need to be performed to achieve one or more of the benefits provided by this disclosure, and therefore not all of the acts and/or functions are required.

Although certain variations have been discussed in connection with one or more examples of this disclosure, these variations can also be applied to all of the other examples of this disclosure as well.

Although select examples of this disclosure have been described, alterations and permutations of these examples will be apparent to those of ordinary skill in the art. Other changes, substitutions, and/or alterations are also possible without departing from the invention in its broader aspects as set forth in the following claims.

The invention claimed is:

1. A method comprising:
   determining, by a playback device, a first loudness level of a first portion of first media content from a first source while the playback device presents the first media content, wherein the first portion has a first length;
   switching, by the playback device, from presenting the first media content from the first source to presenting second media content from a second source;
   while the playback device presents the second media content from the second source, receiving, by the playback device, an audio signal corresponding to the first media content;
   based on the switching, determining, by the playback device, second loudness levels of second portions of the first media content using the audio signal corresponding to the first media content while the playback device presents the second media content, wherein the second portions have a second length that is shorter than the first length; and
   while the playback device presents the second media content, adjusting, by the playback device, a volume of the playback device based on one or more of the second loudness levels.

2. The method of claim 1, wherein the second loudness levels comprise a loudness level of a given portion and a loudness level of a subsequent portion, wherein the method further comprises determining that the loudness level of the given portion differs from the loudness level of the subsequent portion by more than a threshold amount, and wherein adjusting the volume of the playback device comprises adjusting the volume based on a difference between the loudness level of the given portion and the loudness level of the subsequent portion.

3. The method of claim 2, further comprising determining a target volume based on the difference, wherein adjusting the volume comprises adjusting the volume toward the target volume.

4. The method of claim 1, wherein adjusting the volume based on one or more of the second loudness levels comprises:
   comparing a given loudness level of the second loudness levels with a reference loudness level indicated by a loudness level profile for the first media content;
   determining a target volume level for the playback device based on a difference between the given loudness level and the reference loudness level; and
   adjusting the volume toward the target volume level.

5. The method of claim 4, wherein the loudness level profile comprises respective loudness levels for portions of the first media content, and wherein the method further comprises aligning the loudness level profile with the first media content that the playback device is receiving.

6. The method of claim 1, wherein adjusting the volume based on one or more of the second loudness levels comprises:

providing the second loudness levels as input to a neural network, wherein the neural network is trained using audio samples that include volume adjustments;
detecting a volume adjustment to the first media content based on an output of the neural network; and
adjusting the volume based on the volume adjustment.

7. The method of claim 1, wherein determining the first loudness level comprises determining a moving average of the first loudness level.

8. The method of claim 7, further comprising:
detecting a channel-change event; and
upon detecting the channel-change event, resetting the moving average of the first loudness level.

9. The method of claim 1, further comprising:
determining a loudness level of the second media content; and
based on a difference between the first loudness level and the loudness level of the second media content, adjusting the loudness level of the second media content prior to presenting the second media content.

10. The method of claim 1, wherein the playback device comprises a television, and wherein presenting the second media content comprises presenting a replacement advertisement using a media player.

11. The method of claim 1, wherein the second media content is stored in a local cache of the playback device, and wherein the method further comprises retrieving the second media content from the local cache prior to presenting the second media content.

12. A non-transitory computer-readable medium having stored thereon program instructions that upon execution by a processor, cause performance of a set of acts comprising:
determining a first loudness level of a first portion of first media content from a first source while a playback device presents the first media content, wherein the first portion has a first length;
switching from presenting the first media content from the first source to presenting second media content from a second source;
while the playback device presents the second media content from the second source, receiving an audio signal corresponding to the first media content;
based on the switching, determining second loudness levels of second portions of the first media content using the audio signal corresponding to the first media content while the playback device presents the second media content, wherein the second portions have a second length that is shorter than the first length; and
while the playback device presents the second media content, adjusting a volume of the playback device based on one or more of the second loudness levels.

13. The non-transitory computer-readable medium of claim 12, wherein the second loudness levels comprise a loudness level of a given portion and a loudness level of a subsequent portion, wherein the set of acts further comprises determining that the loudness level of the given portion differs from the loudness level of the subsequent portion by more than a threshold amount, and wherein adjusting the volume of the playback device comprises adjusting the volume based on a difference between the loudness level of the given portion and the loudness level of the subsequent portion.

14. The non-transitory computer-readable medium of claim 12, wherein adjusting the volume based on one or more of the second loudness levels comprises:
comparing a given loudness level of the second loudness levels with a reference loudness level indicated by a loudness level profile for the first media content;
determining a target volume level for the playback device based on a difference between the given loudness level and the reference loudness level; and
adjusting the volume toward the target volume level.

15. The non-transitory computer-readable medium of claim 12, wherein the playback device comprises a television, and wherein presenting the second media content comprises presenting a replacement advertisement using a media player.

16. The non-transitory computer-readable medium of claim 12, wherein the second media content is stored in a local cache of the playback device, and wherein the set of acts further comprises retrieving the second media content from the local cache prior to presenting the second media content.

17. A computing system configured for performing a set of acts comprising:
determining a first loudness level of a first portion of first media content from a first source while a playback device presents the first media content, wherein the first portion has a first length;
switching from presenting the first media content from the first source to presenting second media content from a second source;
while the playback device presents the second media content from the second source, receiving an audio signal corresponding to the first media content;
based on the switching, determining second loudness levels of second portions of the first media content using the audio signal corresponding to the first media content while the playback device presents the second media content, wherein the second portions have a second length that is shorter than the first length; and
while the playback device presents the second media content, adjusting a volume of the playback device based on one or more of the second loudness levels.

18. The computing system of claim 17, wherein the second loudness levels comprise a loudness level of a given portion and a loudness level of a subsequent portion, wherein the set of acts further comprises determining that the loudness level of the given portion differs from the loudness level of the subsequent portion by more than a threshold amount, and wherein adjusting the volume of the playback device comprises adjusting the volume based on a difference between the loudness level of the given portion and the loudness level of the subsequent portion.

19. The computing system of claim 17, wherein adjusting the volume based on one or more of the second loudness levels comprises:
comparing a given loudness level of the second loudness levels with a reference loudness level indicated by a loudness level profile for the first media content;
determining a target volume level for the playback device based on a difference between the given loudness level and the reference loudness level; and
adjusting the volume toward the target volume level.

20. The computing system of claim 17, wherein the second media content is stored in a local cache of the playback device, and wherein the set of acts further comprises retrieving the second media content from the local cache prior to presenting the second media content.

* * * * *